(12) United States Patent
Takizawa et al.

(10) Patent No.: US 9,880,000 B2
(45) Date of Patent: Jan. 30, 2018

(54) MANUFACTURING METHOD OF INERTIAL SENSOR AND INERTIAL SENSOR

(71) Applicant: Seiko Epson Corporation, Tokyo (JP)

(72) Inventors: Teruo Takizawa, Matsumoto (JP); Atsuki Naruse, Shiojiri (JP); Shigekazu Takagi, Shiojiri (JP)

(73) Assignee: Seiko Epson Corporation (JP)

( * ) Notice: Subject to any disclaimer, the term of this patent is extended or adjusted under 35 U.S.C. 154(b) by 139 days.

(21) Appl. No.: 14/938,268

(22) Filed: Nov. 11, 2015

(65) Prior Publication Data

US 2016/0138921 A1    May 19, 2016

(30) Foreign Application Priority Data

Nov. 14, 2014 (JP) ................................ 2014-231725

(51) Int. Cl.
| | |
|---|---|
| *G01P 15/00* | (2006.01) |
| *G01C 19/5769* | (2012.01) |
| *G01C 19/5712* | (2012.01) |
| *G01P 15/125* | (2006.01) |
| *G01P 15/08* | (2006.01) |
| *B81C 1/00* | (2006.01) |

(52) U.S. Cl.
CPC ...... *G01C 19/5769* (2013.01); *B81C 1/00301* (2013.01); *G01C 19/5712* (2013.01); *G01P 15/0802* (2013.01); *G01P 15/125* (2013.01); *G01P 2015/0814* (2013.01)

(58) Field of Classification Search
CPC ............... G01P 15/0802; G01P 15/125; G01C 19/5712; G01C 19/5769; G01C 19/5783; B81B 7/0032; B81B 2201/0228; B81B 2207/115; B81C 1/00261; B81C 1/00301; B81C 1/00333; B81C 1/00603; B81C 2203/0145
USPC ................................ 73/488, 504.02, 514.01
See application file for complete search history.

(56) References Cited

U.S. PATENT DOCUMENTS

| | | |
|---|---|---|
| 7,484,279 B2 | 2/2009 | Aoki |
| 9,038,463 B2 | 5/2015 | Takizawa |
| 9,144,159 B2 | 9/2015 | Takagi |

(Continued)

FOREIGN PATENT DOCUMENTS

| | | |
|---|---|---|
| JP | 2007-081867 A | 3/2007 |
| JP | 2013-024762 A | 2/2013 |

(Continued)

*Primary Examiner* — Benjamin Schmitt
(74) *Attorney, Agent, or Firm* — Harness, Dickey & Pierce, P.L.C.

(57) ABSTRACT

A manufacturing method of an inertial sensor which includes a movable body that is disposed in a cavity formed by a base body and a lid, and in which a wiring groove of wiring communicating with the cavity and electrically connected to the movable body is formed in the base body, includes forming a first opening section, which does not penetrate through the lid by wet etching; accommodating the movable body in the cavity by bonding the base body and the lid; forming a first sealing material with which the wiring groove is sealed after the accommodating of the movable body; forming a through-hole communicating with the cavity by penetrating through the first opening section by dry etching after the forming of the first sealing material; and forming a second sealing material with which the through-hole is sealed.

4 Claims, 19 Drawing Sheets

(56) References Cited

U.S. PATENT DOCUMENTS

| | | | |
|---|---|---|---|
| 2007/0058003 A1* | 3/2007 | Aoki | H03H 9/0547 347/68 |
| 2009/0195125 A1* | 8/2009 | Matsugi | H01L 23/10 310/348 |
| 2010/0201221 A1* | 8/2010 | Inoue | H03H 3/04 310/312 |
| 2013/0206465 A1 | 8/2013 | Takagi | |
| 2013/0265701 A1 | 10/2013 | Takizawa | |
| 2015/0059475 A1 | 3/2015 | Takagi | |

FOREIGN PATENT DOCUMENTS

| | | |
|---|---|---|
| JP | 2013-069858 A | 4/2013 |
| JP | 2013-079868 A | 5/2013 |
| JP | 2013-101031 A | 5/2013 |
| JP | 2013-102036 A | 5/2013 |
| JP | 2013-164285 A | 8/2013 |
| JP | 2013-164301 A | 8/2013 |
| JP | 2013-232626 A | 11/2013 |
| JP | 2014-134482 A | 7/2014 |
| JP | 2014-232037 A | 12/2014 |
| JP | 2015-004517 A | 1/2015 |
| JP | 2015-031513 A | 2/2015 |
| JP | 2015-052456 A | 3/2015 |

* cited by examiner

MANUFACTURING METHOD OF INERTIAL SENSOR AND INERTIAL SENSOR

BACKGROUND

1. Technical Field

The present invention relates to a manufacturing method of an inertial sensor and the inertial sensor.

2. Related Art

In recent years, an inertial sensor for detecting physical quantities by using a silicon Micro Electro Mechanical System (MEMS) technique has been developed. In particular, for example, in an acceleration sensor for detecting acceleration and a gyro sensor for detecting an angular velocity, applications of an image stabilization function of a digital still camera (DSC), a motion sensing function of a navigation of an automobile and a game machine, and the like have been rapidly expanded.

For example, a technique in which a movable body is disposed in a cavity formed by a base body and a lid, a wiring groove of wiring electrically connected to the movable body is formed in the base body, a through-hole communicating with the cavity is formed in the lid, and the wiring groove and the through-hole are sealed with a sealing material is disclosed in JP-A-2013-164285 and JP-A-2013-164301.

However, in the techniques disclosed in JPA-2013-164285 and JP-A-2013-164301, after the through-hole is formed in the lid, the base body and the lid are bonded, and then the wiring groove is sealed with the sealing material. Thus, the sealing material with which the wiring groove is sealed enters the cavity from the through-hole formed in the lid and is attached to the movable body. As a result, the sealing material attached to the movable body has adverse effects (sticking to the movable body, an increase of electrostatic capacitance, and the like) on the characteristics of the inertial sensor.

SUMMARY

An advantage of some aspects of the invention is to provide a manufacturing method of an inertial sensor in which a sealing material can be suppressed from being attached to a movable body. In addition, another advantage of some aspects of the invention is to provide an inertial sensor in which the sealing material can be suppressed from being attached to the movable body.

The invention can be realized in the following aspects or application examples.

Application Example 1

According to this application example, there is provided a manufacturing method of an inertial sensor which includes a movable body that is disposed in a cavity formed by a base body and a lid, and in which a wiring groove of wiring communicating with the cavity and electrically connected to the movable body is formed in the base body, the manufacturing method including forming a first opening section, which does not penetrate through the lid by wet etching; accommodating the movable body in the cavity by bonding the base body and the lid; forming a first sealing material with which the wiring groove is sealed after the accommodating of the movable body; forming a through-hole communicating with the cavity by penetrating through the first opening section by dry etching after the forming of the first sealing material; and forming a second sealing material with which the through-hole is sealed.

In such a manufacturing method of the inertial sensor, in the forming of the first sealing material, since the first opening section is not penetrated though, it is possible to suppress the first sealing material from being attached to the movable body by entering the cavity.

Moreover, in the description according to the invention, for example, the phrase "electrically connected" refers to "a specific member (hereinafter, referred to as 'B member') is 'electrically connected' to another specific member (hereinafter, referred to as 'A member')" and the like. In the description according to the invention, in such an example, the phrase "electrically connected" is used in a case including a case where the A member and the B member are directly electrically connected and a case where the A member and the B member are electrically connected through another member.

Application Example 2

In the manufacturing method of an inertial sensor according to the application example, the forming of the first sealing material may be performed by forming a thin film by a vapor phase growing method.

In such a manufacturing method of an inertial sensor, the wiring groove can be sealed with the thin film.

Application Example 3

In the manufacturing method of an inertial sensor according to the application example, the forming of the second sealing material may be performed by heating and melting a solder ball.

In such a manufacturing method of an inertial sensor, the through-hole can be sealed with the solder ball.

Application Example 4

In the manufacturing method of an inertial sensor according to the application example, the manufacturing method may further include forming a second opening section, which is not penetrated through, communicating with the cavity in the lid. An opening area of the second opening section may be smaller than the minimum opening area of the first opening section, and in the forming of the through-hole, the through-hole may be formed by communicating the first opening section with the second opening section.

In such a manufacturing method of an inertial sensor, it is possible to suppress the solder ball from attaching to the movable body by causing a part of the solder ball to enter the cavity when heating and melting the solder ball.

Application Example 5

According to this application example, there is provided an inertial sensor including a base body; a lid; a movable body that is formed in a cavity formed by the base body and the lid; a first sealing material which is provided in the base body and with which a wiring groove communicating with the cavity is sealed; wiring that is provided in the wiring groove and is electrically connected to the movable body; and a second sealing material which is provided in the lid and with which a through-hole communicating with the cavity is sealed. The through-hole has a first portion of which an opening area is gradually increased from a cavity side to an opposite side of the cavity, and a second portion that is positioned further on the opposite side of the cavity than the first portion, communicates with the first portion, and has an area greater than the maximum opening area of the first portion. A step is provided on an inner surface of the through-hole at a boundary between the first portion and the second portion.

In such an inertial sensor, it is possible to suppress the sealing material from attaching to the movable body.

Application Example 6

In the inertial sensor according to the application example, the through-hole may have a third portion that is positioned further on the cavity side than the first portion, communicates with the first portion and the cavity, and has an area smaller than the minimum opening area of the first portion. A step may be provided on an inner surface of the through-hole at a boundary between the first portion and the third portion.

In such an inertial sensor, it is possible to suppress a part of the solder ball from attaching to the movable body by entering the cavity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferable embodiments of the invention will be described with reference to the drawings. Moreover, the embodiments described below do not unduly limit the content of the invention described in the claims. In addition, all of the configurations described below are not essential configuration requirements of the invention.

1. First Embodiment 1.1. Inertial Sensor

Figure 1:
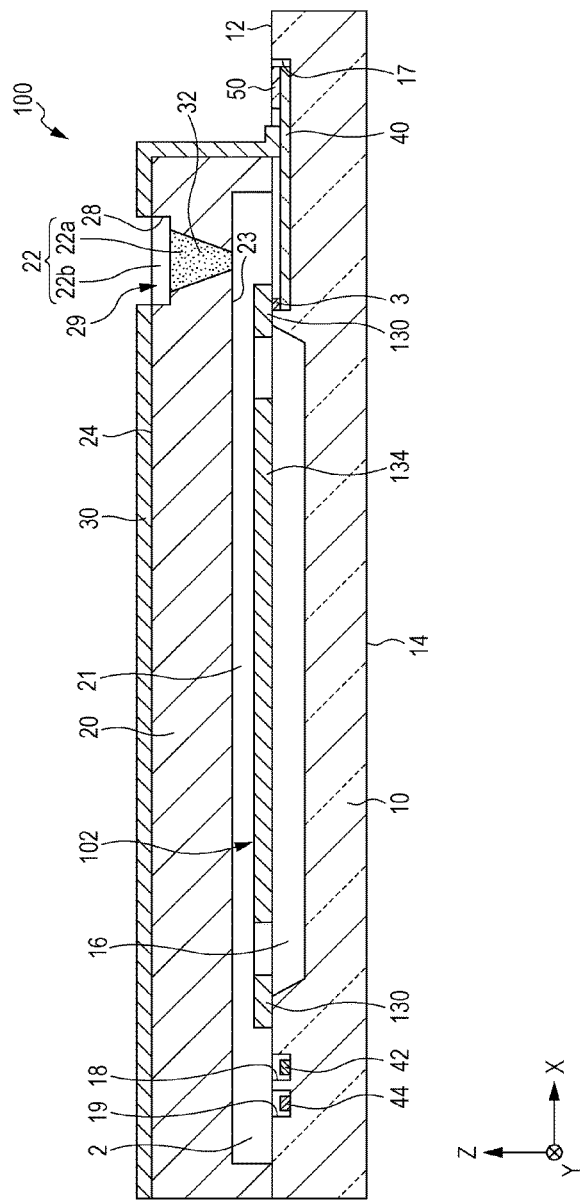
FIG. 1 is a sectional view schematically illustrating an inertial sensor according to a first embodiment.
Figure 2:
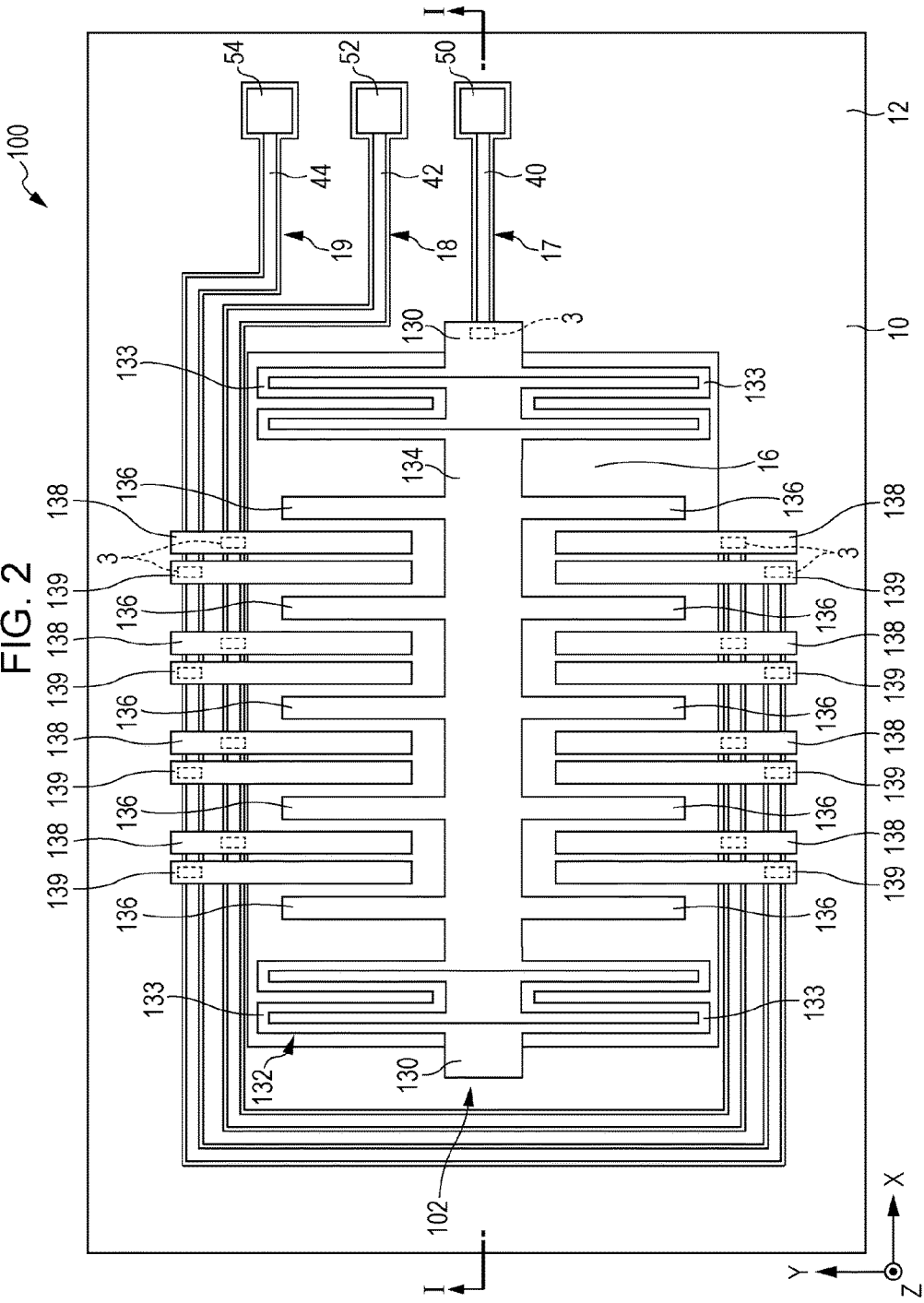
FIG. 2 is a plan view schematically illustrating the inertial sensor according to the first embodiment.
Figure 3:
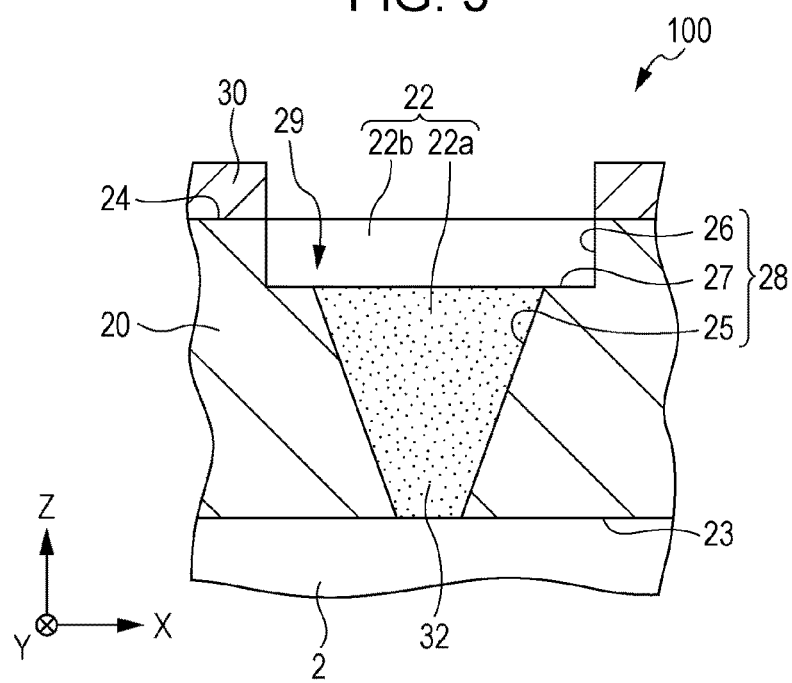
FIG. 3 is a sectional view schematically illustrating the inertial sensor according to the first embodiment.
Figure 4:
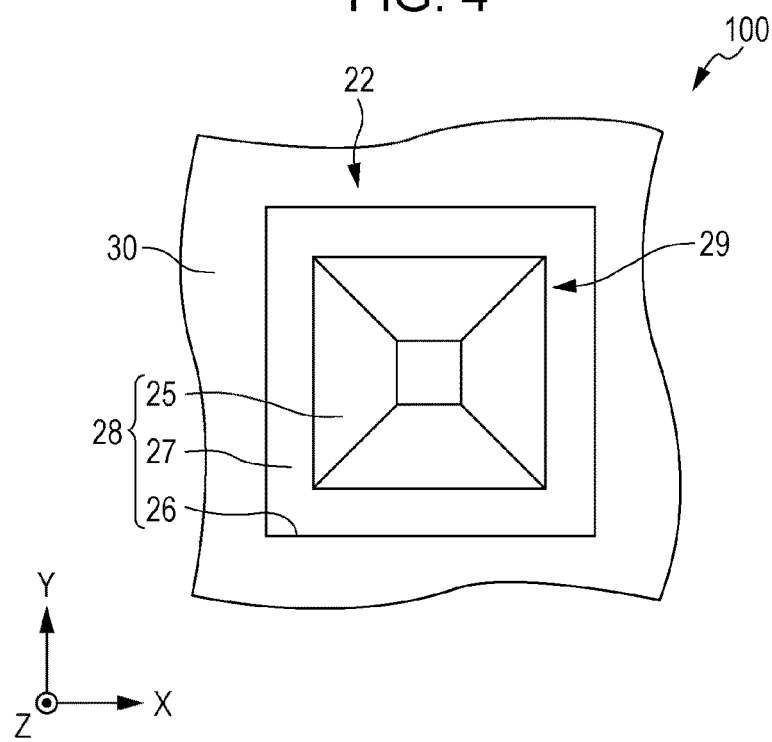
FIG. 4 is a plan view schematically illustrating the inertial sensor according to the first embodiment.

First, an inertial sensor according to a first embodiment will be described with reference to the drawings. FIG. 1 is a sectional view schematically illustrating an inertial sensor 100 according to the first embodiment. FIG. 2 is a plan view schematically illustrating the inertial sensor 100 according to the first embodiment. FIG. 3 is a sectional view schematically illustrating the inertial sensor 100 according to the first embodiment and an enlarged view in the vicinity of a through-hole 22. FIG. 4 is a plan view schematically illustrating the inertial sensor 100 according to the first embodiment and an enlarged view in the vicinity of the through-hole 22. Moreover, FIG. 1 is a sectional view that is taken along line I-I of FIG. 2. In addition, FIGS. 1 to 4 illustrate an X axis, a Y axis, and a Z axis as three axes orthogonal to each other.

The inertial sensor 100 is, for example, an acceleration sensor and a gyro sensor. Hereinafter, a case where the inertial sensor 100 is the acceleration sensor for detecting acceleration in an X axis direction will be described.

As illustrated in FIGS. 1 to 4, the inertial sensor 100 includes a base body 10, a lid 20, a first sealing material 30, a second sealing material 32, wirings 40, 42, and 44, pads 50, 52, and 54, and a functional element 102. Moreover, for the sake of convenience, the lid 20 and the sealing materials 30 and 32 are omitted in FIG. 2. Furthermore, the second sealing material 32 is omitted in FIG. 4.

A material of the base body 10, for example, is glass. Specifically, the material of the base body 10 is a soda glass formed by adding soda ash to silica sand and a heat-resistant glass formed by adding borax, alumina, and the like to silica sand. Otherwise, any material may be used as long as it is a material that transmits laser light such as quartz and quartz glass.

The base body 10 has a first surface 12 and a second surface 14 facing (facing a direction opposite to the first surface 12) the first surface 12. A concave section 16 is formed in the first surface 12 and a movable body 134 of the functional element 102 is disposed above (on a side in a +Z axis direction) the concave section 16. The concave section 16 configures a cavity 2.

The first surface 12 of the base body 10 is provided with wiring grooves 17, 18, and 19. The first wiring groove 17 communicates with the cavity 2. The second wiring groove 18 and the third wiring groove 19 do not communicate with the cavity 2. The wiring grooves 17, 18, and 19 have regions that overlap the lid 20 and regions that do not overlap the lid 20 in a plan view (viewed from the Z axis direction).

The lid 20 is provided on (on the side in the +Z axis direction) the base body 10. A material of the lid 20 is, for example, silicon. The lid 20 is bonded to the first surface 12 of the base body 10. The base body 10 and the lid 20 may be bonded by anodic bonding. A thickness (maximum length in the Z axis direction) of the lid 20 is, for example, 150 μm or more and 350 μm or less, and more preferably 280 μm. In the illustrated example, a concave section 21 is formed in the lid 20 and the concave section 21 configures the cavity 2. A depth (depth in the Z axis direction) of the concave section 21 is, for example, 10 μm or more and 100 μm or less, and more preferably is 40 μm.

Moreover, a bonding method between the base body 10 and the lid 20 is not specifically limited and, for example, the base body 10 and the lid 20 may be bonded by low-melting point glass (glass paste) or may be bonded by soldering. Otherwise, a metal thin film (not illustrated) is formed in each bonding portion of the base body 10 and the lid 20, the metal thin films are eutectic-bonded, and thereby the base body 10 and the lid 20 may be bonded.

The lid 20 is provided with the through-hole 22 communicating with the cavity 2. The through-hole 22 penetrates through the lid 20 in the thickness direction (Z axis direction). The through-hole 22 is provided from a third surface 23 to a fourth surface 24 of the lid 20. The third surface 23 is a surface dividing the cavity 2 of the lid 20 and the fourth surface 24 is a surface (upper surface of the lid 20) on the opposite side of the third surface 23. In the example illustrated in FIG. 4, a shape of an opening in the third surface 23 and a shape of an opening in the fourth surface 24 of the through-hole 22 are quadrangles (for example, squares). For example, an opening in the third surface 23 of the through-hole 22 does not overlap the functional element 102 in a plan view.

The through-hole 22 has a first portion 22a and a second portion 22b. An opening area of the first portion 22a of the through-hole 22 is gradually increased from a cavity 2 side to the opposite side of the cavity 2. That is, the first portion 22a has a tapered shape in which the opening area is increased from a third surface 23 side to a fourth surface 24 side. Moreover, the opening area is an area of the opening in a plan view (viewed from the Z axis direction).

The first portion 22a of the through-hole 22 communicates with, for example, the cavity 2. The first portion 22a is surrounded by a side surface 25 of the lid 20. The side surface 25 is, for example, a (111) plane and is inclined with respect to the fourth surface 24.

The second portion 22b of the through-hole 22 is positioned further on the opposite side (on the fourth surface 24 side) of the cavity 2 than the first portion 22a. The second portion 22b communicates with the first portion 22a. The second portion 22b has an area greater than the maximum opening area of the first portion 22a. In the example illustrated in FIG. 1, the second portion 22b has a constant opening area from the third surface 23 side to the fourth surface 24 side. The second portion 22b is surrounded by a side surface 26 of the lid 20. The side surface 26 is, for example, a surface parallel to the Z axis. The side surface 25 and the side surface 26 are connected by a connecting surface 27. In the illustrated example, the connecting surface 27 is a surface parallel to the X axis.

A step 29 is provided in an inner surface 28 of the through-hole 22 at a boundary between the first portion 22a and the second portion 22b of the through-hole 22. The inner surface 28 is constituted by the side surfaces 25 and 26, and the connecting surface 27, and the step 29 is formed by the side surfaces 25 and 26, and the connecting surface 27.

The first sealing material 30 is provided in the wiring groove 17. In the example illustrated in FIG. 1, the first sealing material 30 is further provided above the lid 20 and a side of the lid 20. The first wiring groove 17 is sealed with the first sealing material 30. The first wiring groove 17 is sealed with the first sealing material 30 and thereby the cavity 2 is sealed (enclosed space). In the illustrated example, the first sealing material 30 comes into contact with a first wiring 40. A material of the first sealing material 30 is, for example, Tetraethyl Orthosilicate (TEOS). A thickness of the first sealing material 30 is, for example, 1 μm or more and 5 μm or less.

The second sealing material 32 is provided in the through-hole 22. In the illustrated example, the second sealing material 32 is provided such that the first portion 22a of the through-hole 22 is filled with the second sealing material 32. The through-hole 22 is sealed with the second sealing material 32. The through-hole 22 is sealed with the second sealing material 32 and thereby the cavity 2 is sealed (enclosed space). A material of the second sealing material 32 is, for example, AuGe.

The first wiring 40 is provided in the first wiring groove 17. The first wiring 40 is electrically connected to the functional element 102 through a contact section 3. The first wiring 40 is electrically connected to the movable body 134 of the functional element 102.

A second wiring 42 is provided in the second wiring groove 18. The second wiring 42 is connected to a first fixed electrode section 138 of the functional element 102 through the contact section 3. The second wiring 42 is provided so as to surround the concave section 16 in a plan view.

A third wiring 44 is provided in the third wiring groove 19. The third wiring 44 is connected to a second fixed electrode section 139 of the functional element 102 through the contact section 3. The third wiring 44 is provided so as to surround the concave section 16 in a plan view.

The pads 50, 52, and 54 are respectively connected to the wirings 40, 42, and 44. For example, the pads 50, 52, and 54 are respectively provided on the wirings 40, 42, and 44. The pads 50, 52, and 54 are provided at positions which do not overlap the lid 20 in a plan view.

A material of the wirings 40, 42, and 44, the pads 50, 52, and 54, and the contact section 3 (hereinafter, also referred to as "wiring 40 and the like") is, for example, aluminum, gold, and Indium Tin Oxide (ITO). It is possible to easily visually recognize foreign matters and the like present on the wiring 40 and the like from the second surface 14 side of the base body 10 by using a transparent electrode material such as ITO as the wiring 40 and the like.

The functional element 102 is provided on the first surface 12 side of the base body 10. For example, the functional element 102 is bonded to the base body 10 by anodic bonding or direct bonding. The functional element 102 is accommodated (disposed) in the cavity 2 formed by the base body 10 and the lid 20. The cavity 2 is sealed with an inert gas (for example, nitrogen gas) atmosphere.

The functional element 102 includes a fixed section 130, a spring section 132, the movable body 134, a movable electrode section 136, and fixed electrode sections 138 and 139. The spring section 132, the movable body 134, and the movable electrode section 136 are provided above the concave section 16 and are separated from the base body 10.

The fixed section 130 is fixed to the base body 10. For example, the fixed section 130 is bonded to the first surface 12 of the base body 10 by anodic bonding. The fixed section 130 is provided across an outer edge of the concave section 16 in a plan view. For example, two fixed sections 130 are provided. In the illustrated example, the fixed section 130 on one side is provided in the movable body 134 in a −X axis direction and the fixed section 130 of the other side is provided in the movable body 134 in a +X axis direction.

The spring section 132 connects the fixed section 130 and the movable body 134. The spring section 132 is constituted by a plurality of beam sections 133. The beam section 133 extends in the X axis direction while reciprocating in the Y axis direction. The beam section 133 (spring section 132) can smoothly expand and contract in the X axis direction that is a displacement direction of the movable body 134.

A planar shape (shape viewed from the Z axis direction) of the movable body 134 is, for example, a rectangular shape having long sides along the X axis. The movable body 134 is able to be displaced in the X axis direction. Specifically, the movable body 134 is displaced in the X axis direction while elastically deforming the spring section 132 in accordance with the acceleration in the X axis direction. The movable body 134 is electrically connected to the first wiring 40 through the spring section 132, the fixed section 130, and the contact section 3.

The movable electrode section 136 is provided in the movable body 134. In the illustrated example, ten movable electrode sections 136 are provided, five movable electrode sections 136 extend from the movable body 134 in a +Y axis direction and the other five movable electrode sections 136 extend from the movable body 134 in a −Y axis direction. The movable electrode section 136 is electrically connected to the first wiring 40 through the movable body 134 and the like.

The fixed electrode sections 138 and 139 are fixed to the base body 10. For example, the fixed electrode sections 138 and 139 are bonded to the first surface 12 of the base body 10 by anodic bonding. Each one end portion of the fixed electrode sections 138 and 139 of one side is connected to the first surface 12 of the base body 10 as a fixed end, and each one end portion of the other side extends to the movable body 134 side as a free end. The fixed electrode sections 138 and 139 are provided to face the movable electrode section 136. In the example illustrated in FIG. 2, the fixed electrode sections 138 and 139 are alternately provided along the X axis. The first fixed electrode section 138 is electrically connected to the second wiring 42 through the contact section 3. The second fixed electrode section 139 is electrically connected to the third wiring 44 through the contact section 3.

The fixed section 130, the spring section 132, the movable body 134, and the movable electrode section 136 are integrally provided. For example, a material of the fixed section 130, the spring section 132, the movable body 134, the movable electrode section 136, and the fixed electrode sections 138 and 139 is silicon to which conductivity is given by doping impurities such as phosphorus and boron.

In the inertial sensor 100, it is possible to suppress the first sealing material 30 from attaching to the movable body 134 (detailed description will be described below).

Moreover, in the above description, a case where the inertial sensor 100 is the acceleration sensor for detecting the acceleration in the X axis direction is described, but the inertial sensor according to the invention may be an acceleration sensor for detecting acceleration in the Y axis direction or may be an acceleration sensor for detecting acceleration in the Z axis direction.

1.2. Manufacturing Method of Inertial Sensor

Figure 5:
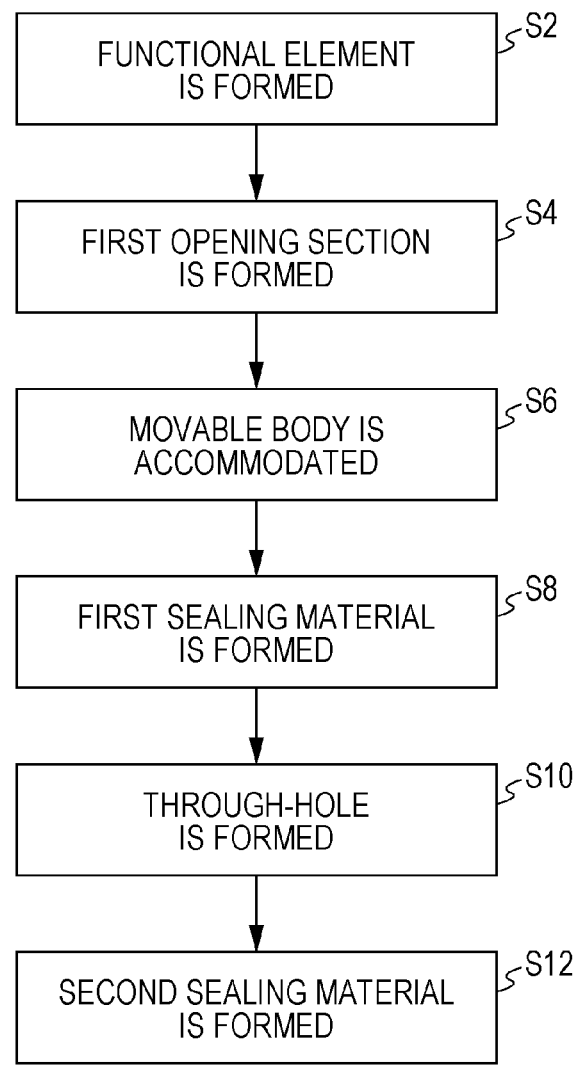
FIG. 5 is a flowchart describing a manufacturing method of an inertial sensor according to the first embodiment.

Next, a manufacturing method of the inertial sensor 100 according to the first embodiment will be described with reference to the drawings. FIG. 5 is a flowchart describing the manufacturing method of the inertial sensor 100 according to the first embodiment. FIGS. 6 to 14 are sectional views schematically illustrating manufacturing processes of the inertial sensor 100 according to the first embodiment.

Figure 6:
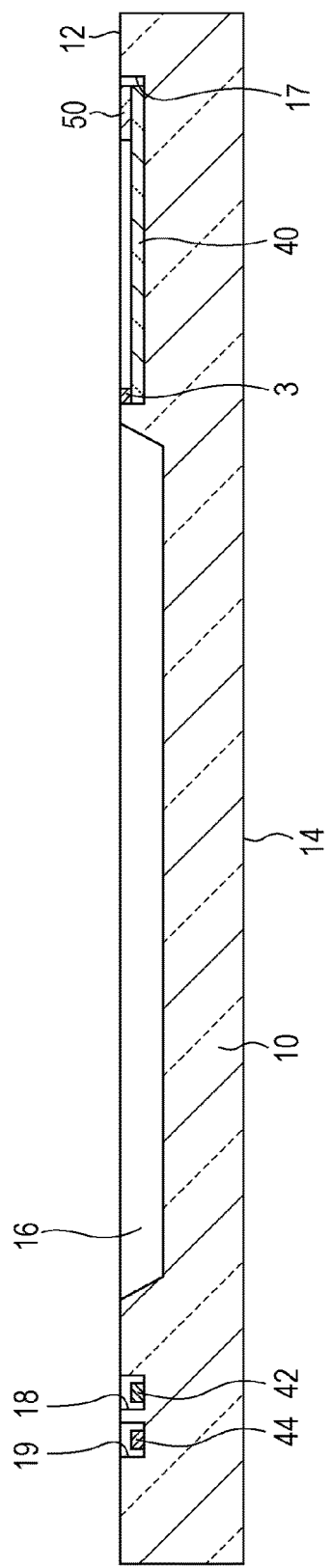
FIG. 6 is a sectional view schematically illustrating a manufacturing process of the inertial sensor according to the first embodiment.

The functional element 102 is formed on the first surface 12 side of the base body 10 (S2). Specifically, first, as illustrated in FIG. 6, the concave section 16 and the wiring grooves 17, 18, and 19 are formed by patterning the base body 10. For example, patterning is performed by photolithography and etching.

Next, the wirings 40, 42, and 44 are respectively formed in the wiring grooves 17, 18, and 19. The pads 50, 52, and 54 are respectively formed on the wirings 40, 42, and 44. Next, the contact section 3 is formed on the wirings 40, 42, and 44. For example, the wirings 40, 42, and 44, the pads 50, 52, and 54, and the contact section 3 are formed by deposition and patterning by a sputtering method or a vapor phase growing method. The vapor phase growing method includes a Chemical Vapor Deposition (CVD) method that is a chemical vapor phase growing method, a Physical Vapor Deposition (PVD) method that is a physical vapor phase growing method, an Atomic Layer Deposition method, and the like. The wirings 40, 42, and 44, the pads 50, 52, and 54, and the contact section 3 consisting of a composite thin film may be formed by using these methods. Moreover, the order of forming the pads 50, 52, and 54, and the contact section 3 is not specifically limited.

Figure 7:
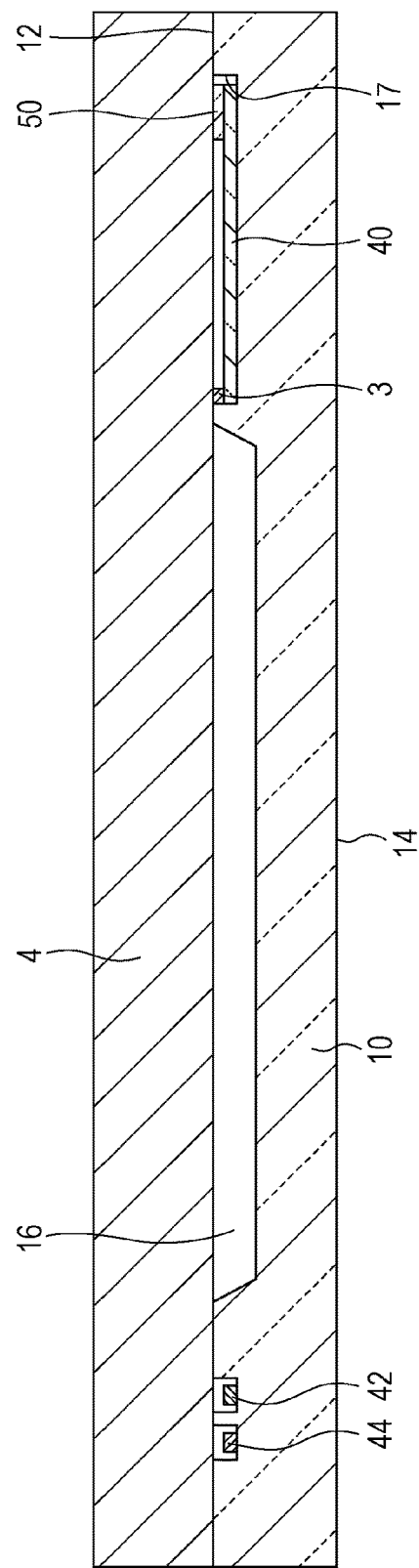
FIG. 7 is a sectional view schematically illustrating the manufacturing process of the inertial sensor according to the first embodiment.

As illustrated in FIG. 7, a silicon substrate 4 is bonded to the first surface 12 of the base body 10. For example, bonding of the base body 10 and the silicon substrate 4 is performed by anodic bonding. Thus, it is possible to firmly bond the base body 10 and the silicon substrate 4.

Figure 8:
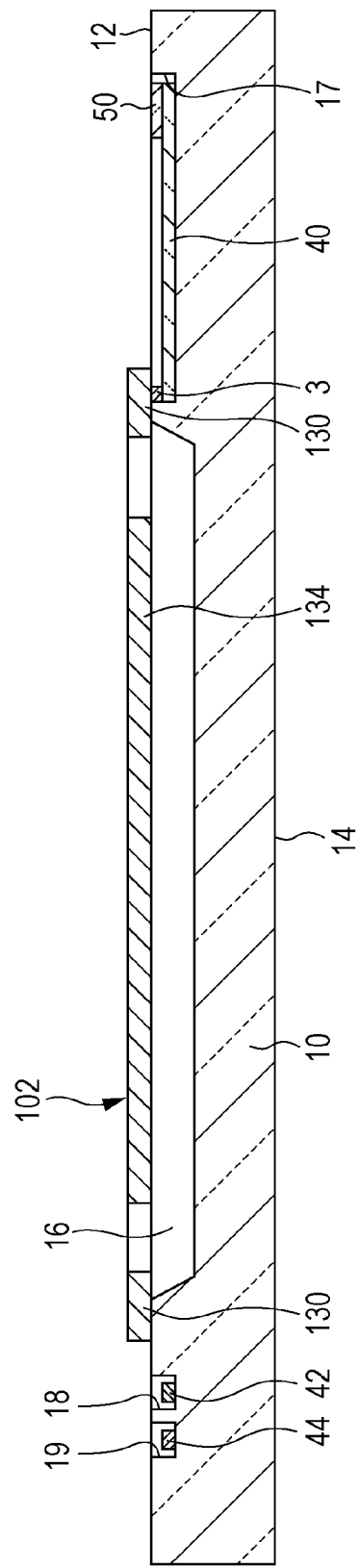
FIG. 8 is a sectional view schematically illustrating the manufacturing process of the inertial sensor according to the first embodiment.

As illustrated in FIG. 8, after the silicon substrate 4 is thinned by grinding, for example, by a grinding machine, the silicon substrate 4 is patterned into a predetermined shape and then the functional element 102 is formed. Patterning is performed by photolithography and etching (dry etching) and as specific etching, it is possible to use a Bosch method.

Figure 9:
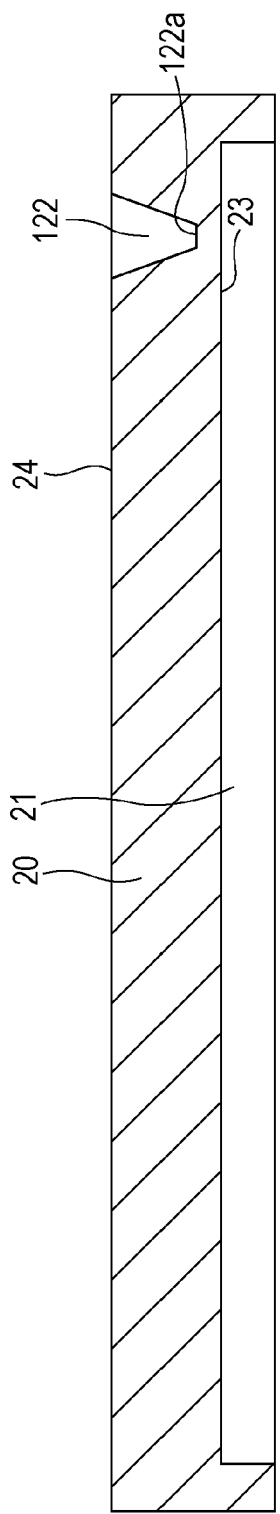
FIG. 9 is a sectional view schematically illustrating the manufacturing process of the inertial sensor according to the first embodiment.

As illustrated in FIG. 9, a first opening section 122 which does not penetrate though the lid 20 is formed by wet etching (S4). Specifically, first, the concave section 21 is formed by patterning the lid 20. For example, patterning is performed by photolithography and etching. The etching may be dry etching or may be wet etching.

Next, the first opening section 122 is formed by photolithography and wet etching from the fourth surface 24 side of the lid 20. For example, wet etching is performed by using an alkaline solution such as KOH. Thus, an inner surface of the first opening section 122 is inclined with respect to the fourth surface 24 of the lid 20. The first opening section 122 is formed so as not to penetrate through the lid 20. A distance between a bottom surface 122a of the first opening section 122 and the third surface 23 is, for example, 1 μm or more and 40 μm or less, and more preferably is 30 μm. A depth of the first opening section 122 is, for example, 150 μm or more and 250 μm or less, and more preferably is 210 μm. Moreover, the order of forming the concave section 21 and the first opening section 122 is not specifically limited.

Figure 10:
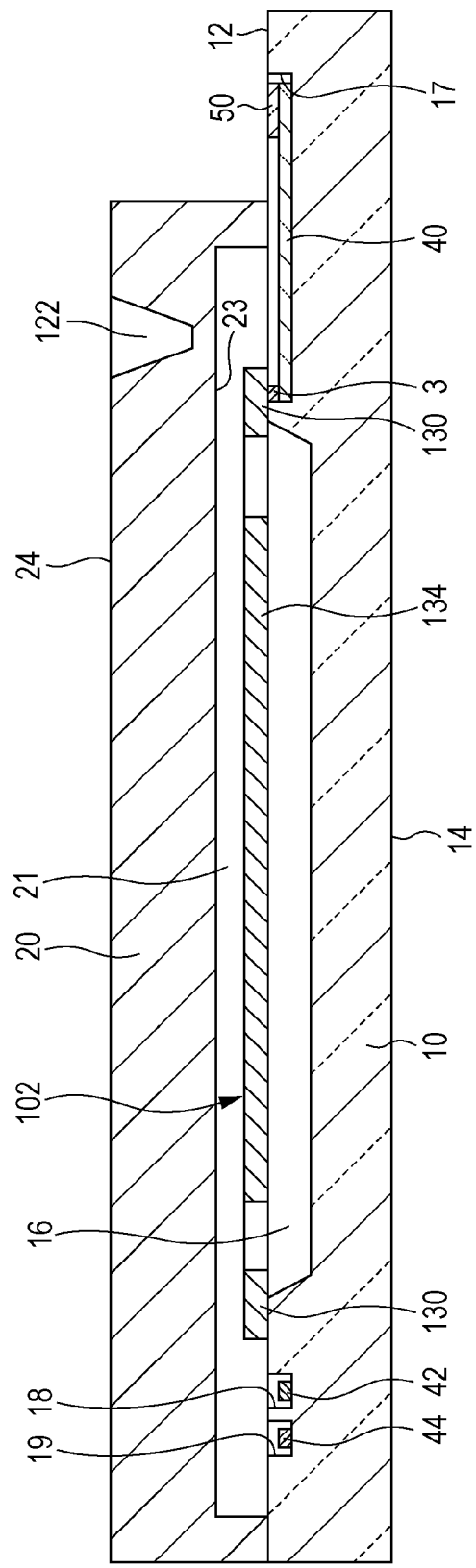
FIG. 10 is a sectional view schematically illustrating the manufacturing process of the inertial sensor according to the first embodiment.

As illustrated in FIG. 10, the movable body 134 (the functional element 102) is accommodated in the cavity 2 formed by the base body 10 and the lid 20 by bonding the base body 10 and the lid 20 (S6). Bonding of the base body and the lid 20 is, for example, performed by anodic bonding. Thus, it is possible to firmly bond the base body 10 and the lid 20.

Figure 11:
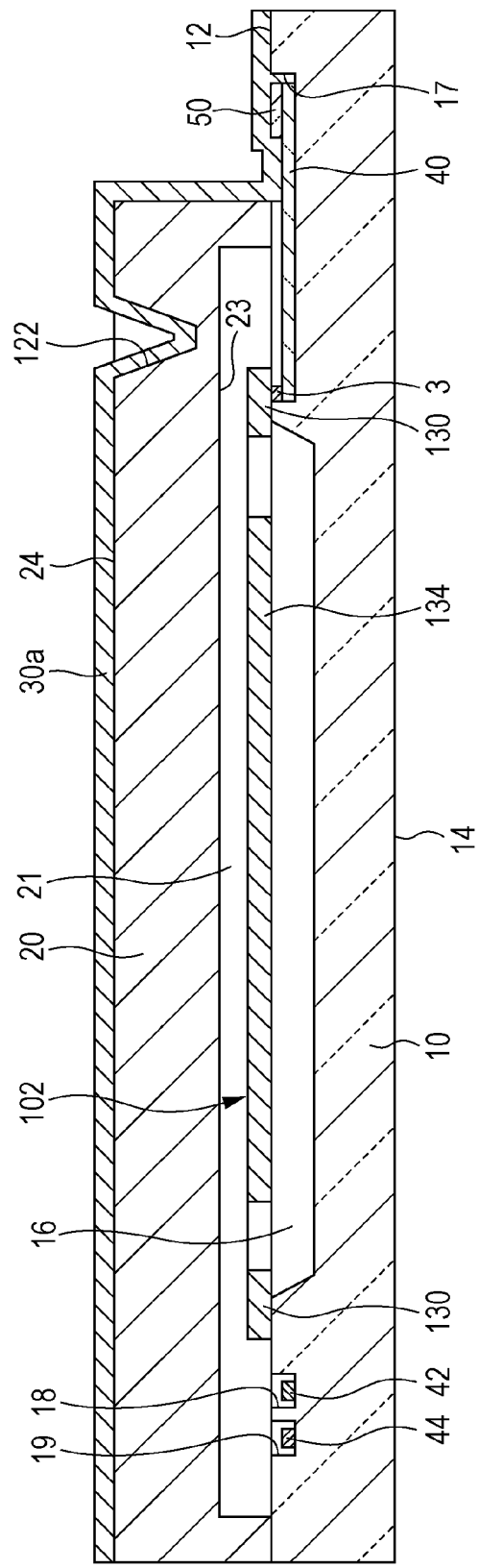
FIG. 11 is a sectional view schematically illustrating the manufacturing process of the inertial sensor according to the first embodiment.

As illustrated in FIG. 11, the first sealing material 30 with which the first wiring groove 17 is sealed is formed (S8). For example, this process is performed by forming a TEOS film (thin film) 30a by using the vapor phase growing method (for example, the CVD method). The TEOS film 30a is formed on the inner surface of the first opening section 122, the lid 20, the wirings 40, 42, and 44, and the pads 50, 52, and 54.

Figure 12:
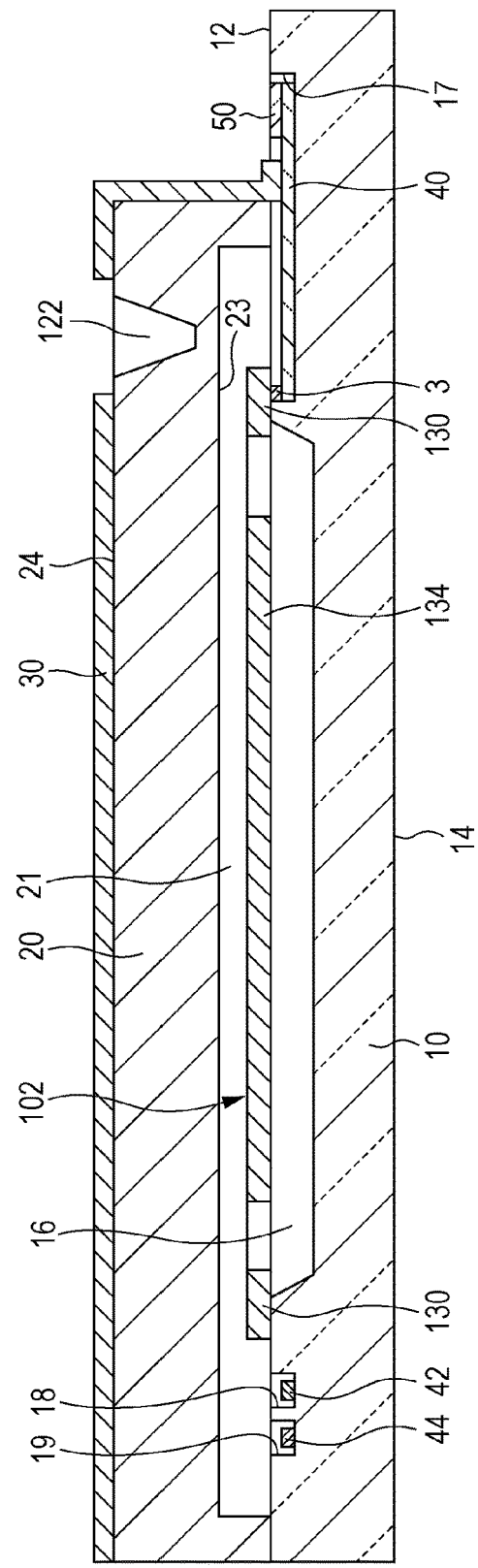
FIG. 12 is a sectional view schematically illustrating the manufacturing process of the inertial sensor according to the first embodiment.

Next, the through-hole 22 is formed in the lid 20 (S10). Specifically, first, as illustrated in FIG. 12, the inner surface of the first opening section 122, a part of the fourth surface 24 of the lid 20, and the pads 50, 52, and 54 are exposed by patterning the first sealing material 30. For example, patterning is performed by dry etching by using a metal mask (not illustrated). For example, dry etching is performed by Reactive Ion Etching (RIE) using CHF3 gas.

Figure 13:
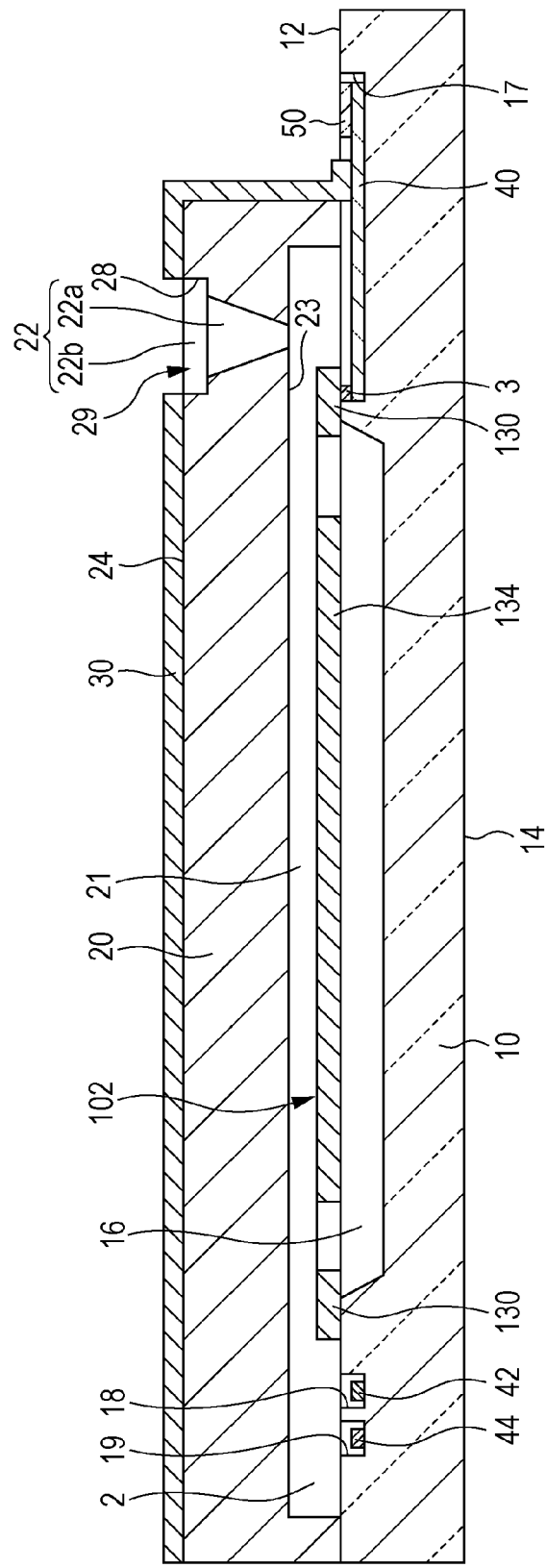
FIG. 13 is a sectional view schematically illustrating the manufacturing process of the inertial sensor according to the first embodiment.

As illustrated in FIG. 13, the through-hole 22 communicating with the cavity 2 is formed by penetrating through the first opening section 122 by dry etching. Specifically, dry etching is performed on the lid 20 by the Bosch method by masking the first sealing material 30 and the through-hole 22 having the first portion 22a, and the second portion 22b is formed. Thus, for example, the inner surface 28 of the second portion 22b is orthogonal to the fourth surface 24 of the lid 20. Dry etching is performed by Deep Reactive Ion Etching (DRIE) using SF6 gas and CHF3 gas.

Figure 14:
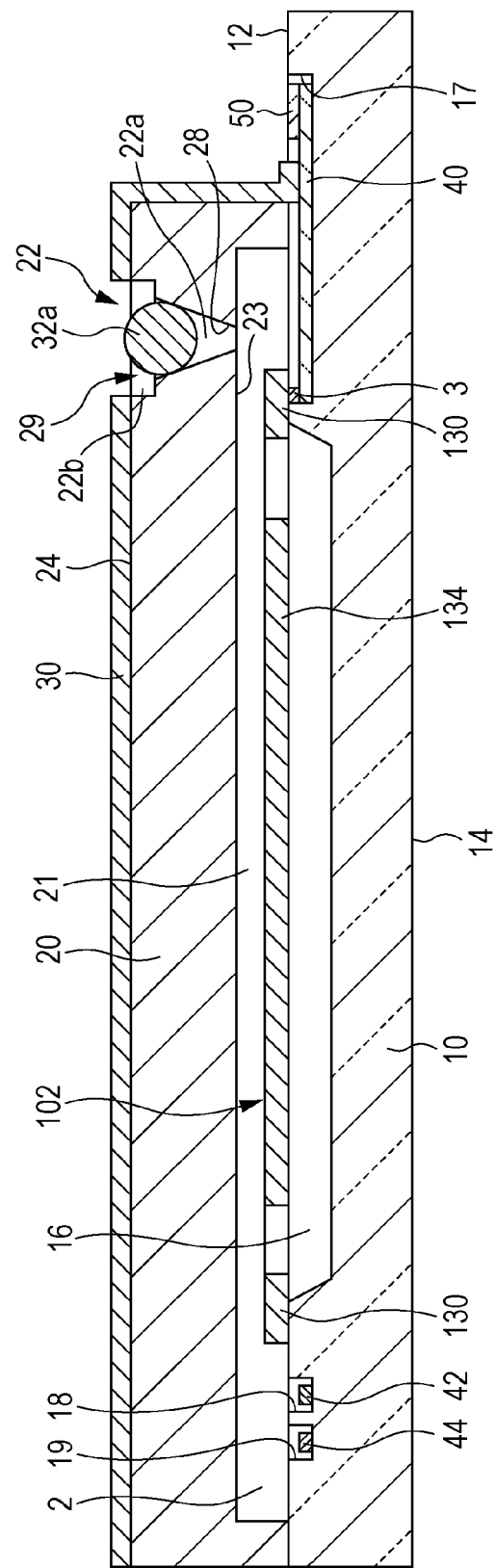
FIG. 14 is a sectional view schematically illustrating the manufacturing process of the inertial sensor according to the first embodiment.

Next, the second sealing material 32 with which the through-hole 22 is sealed is formed (S12). Specifically, first, as illustrated in FIG. 14, a solder ball 32a is disposed in the through-hole 22. The solder ball 32a is disposed by coming into contact with the inner surface 28 of the first portion 22a having a tapered shape. A shape of the solder ball 32a is, for example, spherical. A diameter of the solder ball 32a is, for example, greater than a length of one side of an opening in the third surface 23 of the through-hole 22.

As illustrated in FIG. 2, the second sealing material 32 with which the through-hole 22 is sealed is formed by heating and melting the solder ball 32a. For example, melting of the solder ball 32a is performed by irradiating the solder ball 32a with laser having a short wavelength such as YAG laser and CO2 laser. Thus, it is possible to melt the solder ball 32a in a short period of time. When irradiating the solder ball 32a with laser, the base body 10 may be heated substantially at a eutectic temperature of the solder ball 32a. For example, in a case where a material of the solder ball 32a is AuGe and an Au layer (not illustrated) is formed in the inner surface 28 of the through-hole 22, the base body 10 may be heated to 270° C. that is slightly lower than 280° C. at which eutectic of Au and Ge begins.

For example, a process of heating and melting the solder ball 32a is performed in an inert gas atmosphere. Thus, it is possible to seal the cavity 2 with the inert gas. Viscosity of the inert gas contributes to sensitivity characteristics of the inertial sensor 100 as a damping effect.

It is possible to manufacture the inertial sensor 100 by the process described above.

For example, the manufacturing method of the inertial sensor 100 has the following characteristics.

The manufacturing method of the inertial sensor 100 includes the process (S4) of forming the first opening section 122, which does not penetrated though the lid 20 by wet etching, the process (S6) of accommodating the movable body 134 in the cavity 2 by bonding the base body 10 and the lid 20, the process (S8) of forming the first sealing material 30 with which the first wiring groove 17 is sealed after the process (S6) of accommodating the movable body 134, the process (S10) of forming the through-hole 22 communicating with the cavity 2 by penetrating through the first opening section 122 by dry etching after the process (S8) of forming the first sealing material 30, and the process (S12) of forming the second sealing material 32 with which the through-hole 22 is sealed. As described above, In the manufacturing method of the inertial sensor 100, in the process (S8) of forming the first sealing material 30, since the first opening section 122 is not penetrated though, it is possible to suppress the first sealing material 30 from attaching to the movable body 134 (functional element 102) by entering the cavity 2. As a result, in the manufacturing method of the inertial sensor 100, it is possible to manufacture the inertial sensor 100 that is capable of suppressing malfunction without exerting adverse effects on the inertial sensor 100 by the first sealing material 30.

Furthermore, in the manufacturing method of the inertial sensor 100, in the process (S4) of forming the first opening section 122, the first opening section 122 is formed by wet etching and in the process (S10) of forming the through-hole 22, the through-hole 22 is formed by penetrating through the first opening section 122 by dry etching. Thus, in the manufacturing method of the inertial sensor 100, it is possible to form the through-hole 22 in a short period of time and it is possible to suppress the etching liquid of wet etching from coming into contact with the functional element 102. For example, if the through-hole is formed only by wet etching, the etching liquid of wet etching comes into contact with the functional element and the adverse effects exert on the characteristics of the inertial sensor. Furthermore, if the through-hole is formed only by dry etching, an etching speed is slow and it may take time for the formation of the through-hole.

In the manufacturing method of the inertial sensor 100, the process (S8) of forming the first sealing material 30 is performed by forming the TEOS film by the vapor phase growing method. Thus, in the manufacturing method of the inertial sensor 100, it is possible to seal the first wiring groove 17 with the TEOS film.

In the manufacturing method of the inertial sensor 100, the process (S12) of forming the second sealing material 32 is performed by heating and melting the solder ball 32a. Thus, in the manufacturing method of the inertial sensor 100, it is possible to seal the through-hole 22 with soldering.

In the manufacturing method of the inertial sensor 100, the process (S4) of forming the first opening section 122 is performed before the process (S8) of forming the first sealing material 30. Thus, it is possible to prevent the first sealing material 30 from being etched by wet etching for forming the first opening section 122.

Moreover, in the above description, an example in which the process (S4) of forming the first opening section 122 is performed after the process (S2) of forming the functional element 102 is described, but the process (S4) of forming the first opening section 122 may be performed before the process (S2) of forming the functional element 102.

Furthermore, in the above description, an example in which the process (S4) of forming the first opening section 122 is performed before the process (S6) of accommodating the movable body 134 is described, but the process (S4) of forming the first opening section 122 may be performed after the process (S6) of accommodating the movable body 134 and may be performed after the process (S8) of forming the first sealing material 30.

1.3. Modification Example of Inertial Sensor

1.3.1. First Modification Example

Figure 15:
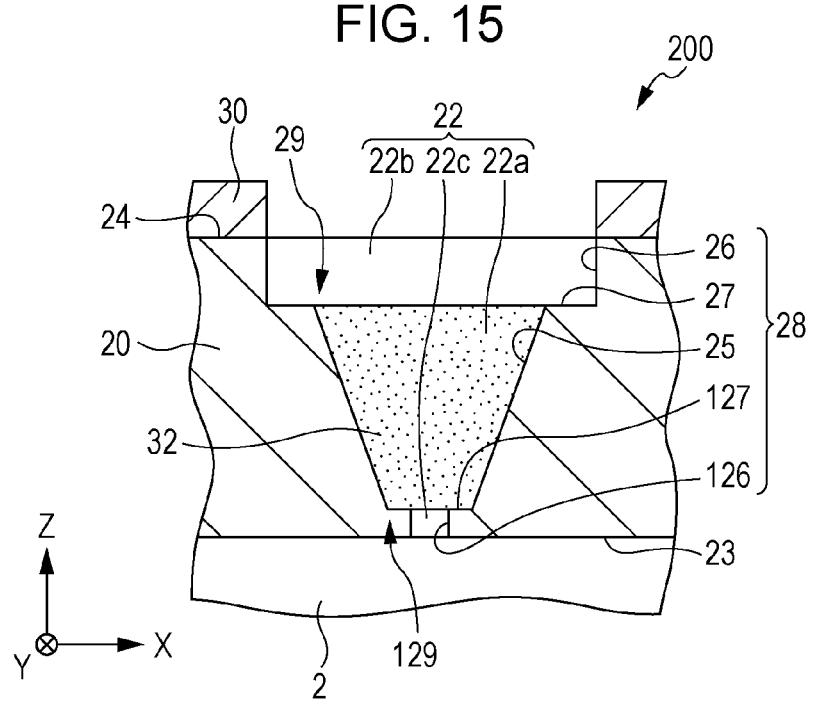
FIG. 15 is a sectional view schematically illustrating an inertial sensor according to a first modification example of the first embodiment.
Figure 16:
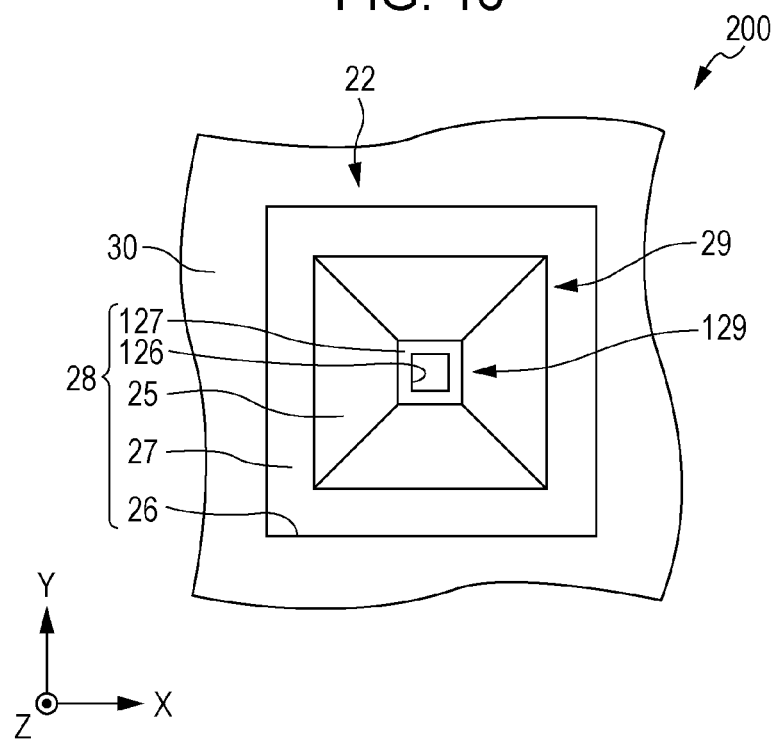
FIG. 16 is a plan view schematically illustrating the inertial sensor according to the first modification example of the first embodiment.

Next, an inertial sensor according to a first modification example of the first embodiment will be described with reference to the drawings. FIG. 15 is a sectional view schematically illustrating an inertial sensor 200 according to the first modification example of the first embodiment and is an enlarged view in the vicinity of a through-hole 22. FIG. 16 is a plan view schematically illustrating the inertial sensor 200 according to the first modification example of the first embodiment and is an enlarged view in the vicinity of the through-hole 22. Moreover, for the sake of convenience, in FIG. 16, a second sealing material 32 is omitted. Furthermore, FIGS. 15 and 16 illustrate an X axis, a Y axis, and a Z axis as three axes orthogonal to each other.

Hereinafter, in the inertial sensor 200 according to the first modification example of the first embodiment, points different from the example of the inertial sensor 100 according to the first embodiment are described and the description of the same points will be omitted.

In the inertial sensor 100 described above, as illustrated in FIGS. 3 and 4, the first portion 22a of the through-hole 22 communicates with the cavity 2. On the other hand, in the inertial sensor 200, as illustrated in FIGS. 15 and 16, a first portion 22a does not communicate with cavity 2. In the inertial sensor 200, the through-hole 22 has the first portion 22a, a second portion 22b, and a third portion 22c.

The third portion 22c of the through-hole 22 is positioned further on the cavity 2 side than the first portion 22a. The third portion 22c communicates with the first portion 22a and the cavity 2. The third portion 22c has an area smaller than the minimum opening area of the first portion 22a. In the example illustrated in FIG. 15, the third portion 22c has a constant opening area from the cavity 2 side to the first portion 22a side. The third portion 22c is surrounded by a side surface 126 of a lid 20. For example, the side surface 126 is a surface parallel to the Z axis. The side surface 126 and a side surface 25 are connected by a connecting surface 127. In the illustrated example, the connecting surface 127 is a surface parallel to the X axis. The side surface 126 and the connecting surface 127 configure an inner surface 28 of a through-hole.

A step 129 is provided on the inner surface 28 of the through-hole 22 at a boundary between the first portion 22a and the third portion 22c of the through-hole 22. The step 129 is formed by the side surfaces 25 and 126, and the connecting surface 127.

Moreover, despite being not illustrated, an opening area of the third portion 22c may be gradually reduced from the cavity 2 side to the first portion 22a side. That is, the third portion 22c may have a tapered shape of which an opening area is reduced from the cavity 2 side to the first portion 22a side.

In the inertial sensor 200, it is possible to suppress a part of the solder ball 32a from attaching to the movable body 134 (the functional element 102) by entering the cavity 2 by the third portion 22c.

Figure 17:
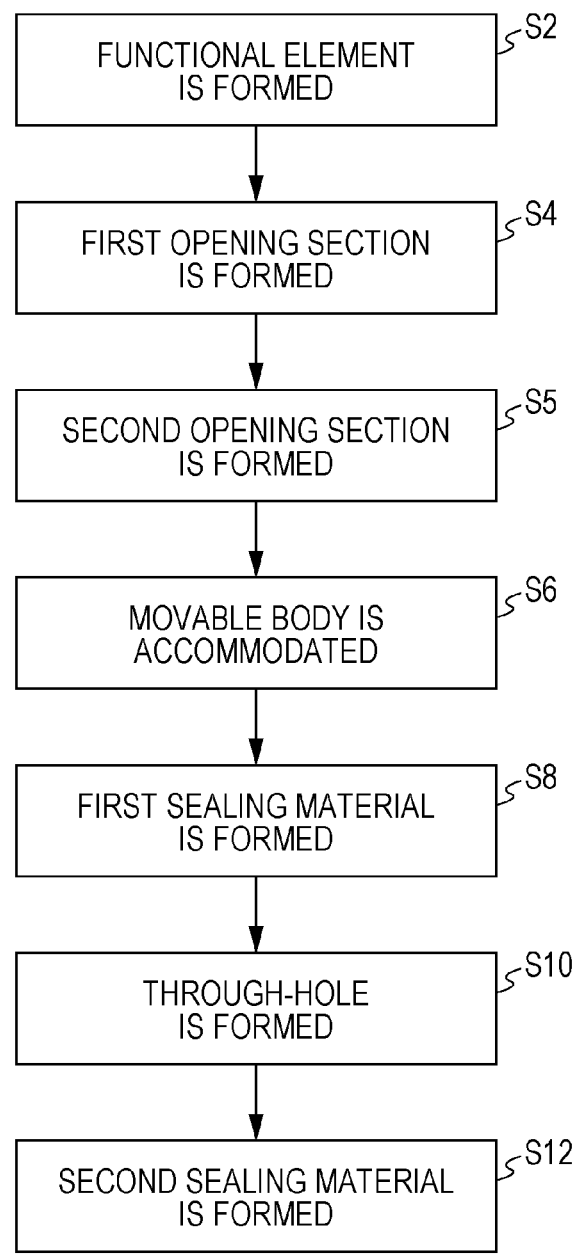
FIG. 17 is a flowchart describing a manufacturing method of an inertial sensor according to the first modification example of the first embodiment.
Figure 18:
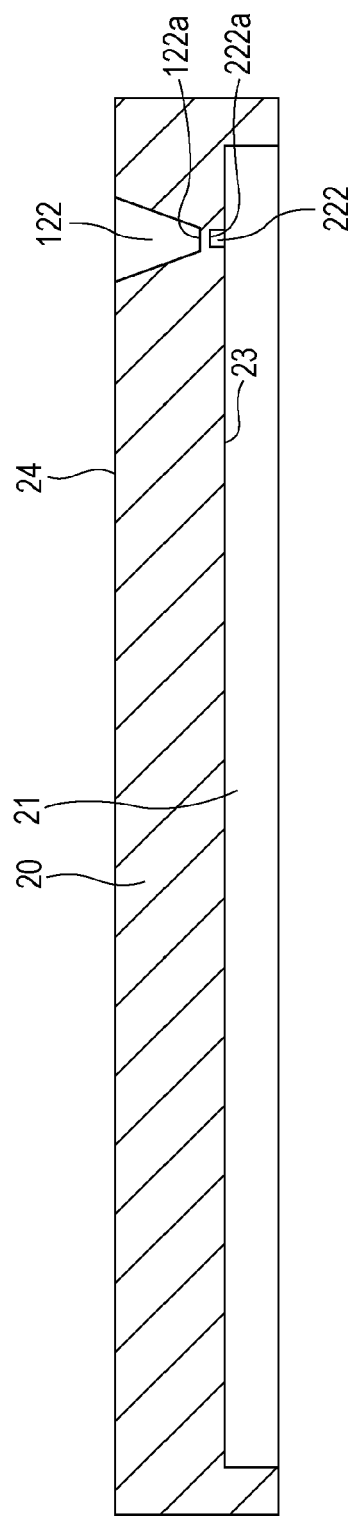
FIG. 18 is a sectional view schematically illustrating a manufacturing process of the inertial sensor according to the first modification example of the first embodiment.

Next, a manufacturing method of the inertial sensor 200 according to the modification of the first embodiment will be described with reference to the drawings. FIG. 17 is a flowchart describing manufacturing processes of the inertial sensor 200 according to a modification example of the first embodiment. FIG. 18 is a sectional view schematically illustrating a manufacturing process of the inertial sensor 200 according to the modification example of the first embodiment.

Hereinafter, in the manufacturing method of the inertial sensor 200 according to the modification example of the first embodiment, points different from the example of the manufacturing method of the inertial sensor 100 according to the first embodiment are described and the description of the same points will be omitted. This also applies to an inertial sensor according to a second modification example of the first embodiment described below.

In the manufacturing method of the inertial sensor 200, for example, after the process (S4) of forming the first opening section 122 in the lid 20 from the fourth surface 24 side, as illustrated in FIG. 18, a second opening section 222, which is not penetrated though, communicating with the cavity 2 (concave section 21 configuring the cavity 2) is formed in the lid 20 from the third surface 23 side (S5). The second opening section 222 is formed such that a bottom surface 222a of the second opening section 222 overlaps the bottom surface 122a of the first opening section 122 in a plan view. The lid 20 is positioned between the bottom surfaces 122a and 222a. The process (S5) of forming the second opening section 222 is performed before the process (S6) of accommodating the movable body 134.

An area of the bottom surface 222a of the second opening section 222 is smaller than an area of the bottom surface 122a of the first opening section 122. In the illustrated example, an opening area of the second opening section 222 is smaller than the minimum opening area of the first opening section 122.

For example, the process (S5) of forming the second opening section 222 is performed by photolithography and etching. The etching may be dry etching or may be wet etching. In a case of dry etching, as illustrated in FIG. 15, it is possible to form the third portion 22c of the through-hole 22 to have a constant opening area from the cavity 2 side to the first portion 22a side. In a case of wet etching, despite being not illustrated, it is possible to form the third portion 22c to have a tapered shape of which an opening area is reduced from the cavity 2 side to the first portion 22a side.

In the manufacturing method of the inertial sensor 200, in the process (S10) of forming the through-hole 22, the through-hole 22 is formed by communicating the first opening section 122 with the second opening section 222. Thus, it is possible to form the through-hole 22 having the first portion 22a, the second portion 22b, and the third portion 22c.

For example, the manufacturing method of the inertial sensor 200 has the following characteristics.

The manufacturing method of the inertial sensor 200 includes a process (S5) of forming the second opening section 222, which is not penetrated though, communicating with the cavity 2 in the lid 20. The opening area of the second opening section 222 is smaller than the minimum opening area of the first opening section 122 and in the process (S10) of forming the through-hole 22, the through-hole 22 is formed by communicating the first opening section 122 with the second opening section 222. Thus, in the manufacturing method of the inertial sensor 200, it is possible to form the third portion 22c having an area smaller than the minimum opening area of the first portion 22a. Thus, when heating and melting the solder ball 32a, it is possible to suppress a part of the solder ball 32a from attaching to the movable body 134 (functional element 102) by entering the cavity 2 by the third portion 22c.

Furthermore, in the above description, an example in which the process (S5) of forming the second opening section 222 is performed after the process (S4) of forming the first opening section 122 is described, but the process (S5) of forming the second opening section 222 may be performed before the process (S4) of forming the first opening section 122.

1.3.2. Second Modification Example

Figure 19:
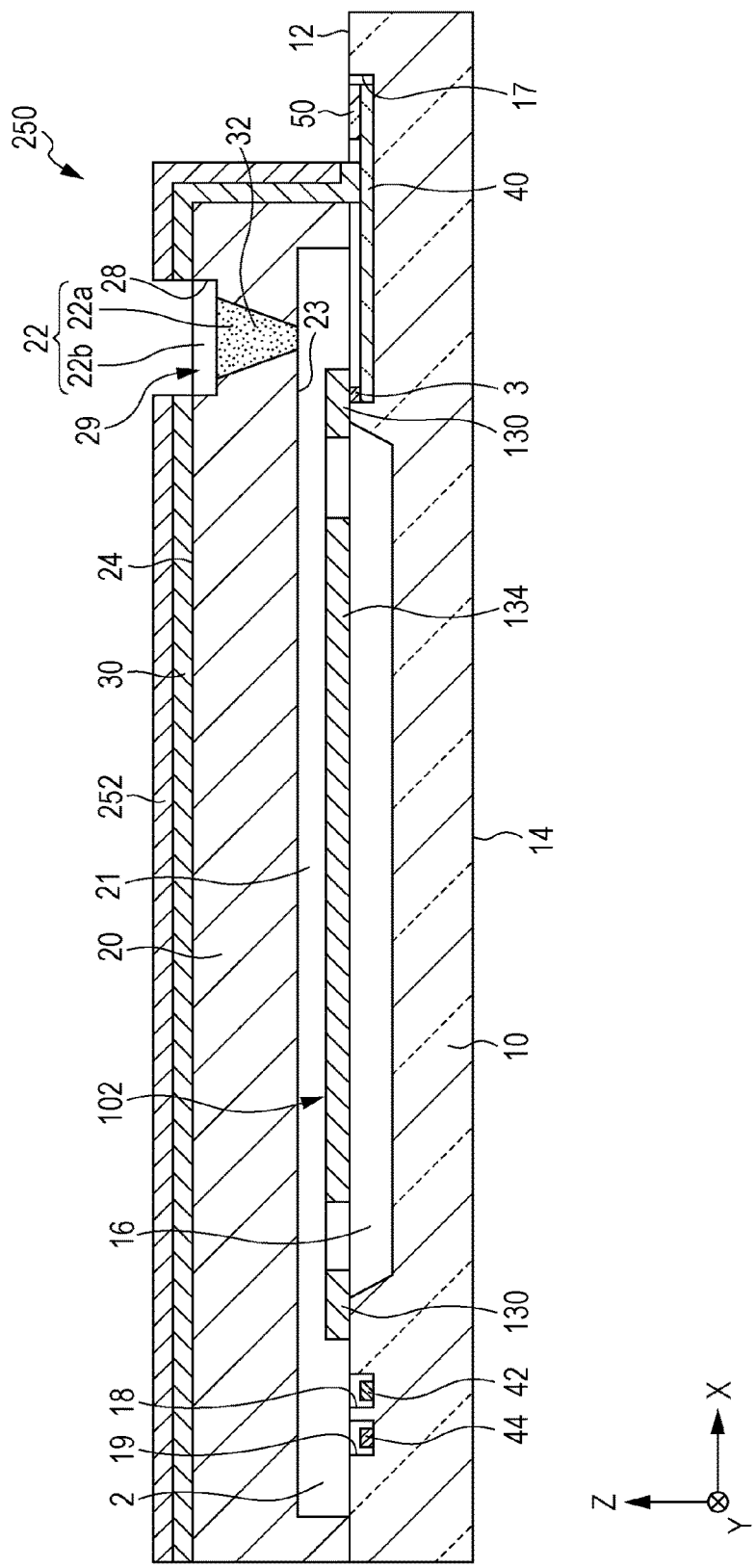
FIG. 19 is a sectional view schematically illustrating an inertial sensor according to a second modification example of the first embodiment.

Next, an inertial sensor according to a second modification example of the first embodiment will be described with reference to the drawings. FIG. 19 is a sectional view schematically illustrating an inertial sensor 250 according to the second modification example of the first embodiment. Furthermore, FIG. 19 illustrates an X axis, a Y axis, and a Z axis as three axes orthogonal to each other.

The inertial sensor 250 is different from the inertial sensor 100 described above in that a barrier layer 252 is provided. As illustrated in FIG. 19, the barrier layer 252 is formed on a first sealing material 30. For example, the barrier layer 252 may be an alumina ($Al_2O_3$) film or may be a laminated film of an alumina film and a tantalum oxide (TaOx) film.

Figure 20:
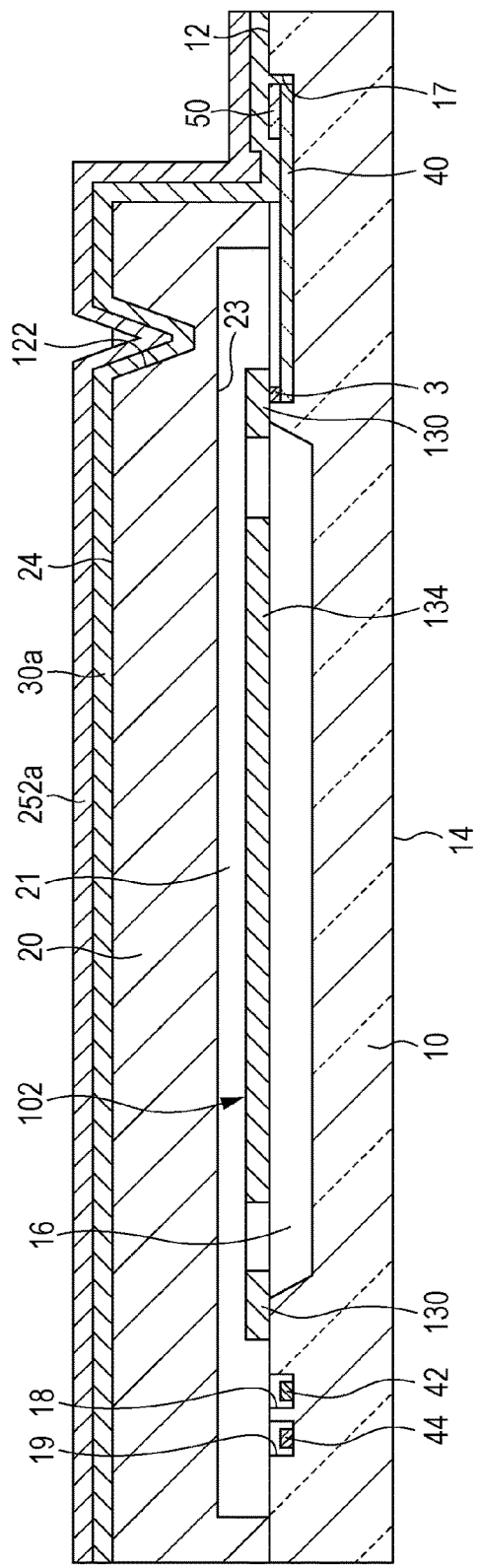
FIG. 20 is a sectional view schematically illustrating a manufacturing process of the inertial sensor according to the second modification example of the first embodiment.

As illustrated in FIG. 20, for example, the manufacturing method of the inertial sensor 250 according to the second modification example of the first embodiment is basically the same as the manufacturing method of the inertial sensor 100 according to the first embodiment except that an alumina film 252a is deposited on the TEOS film 30a by an atomic layer deposition method (ALD method) and the barrier layer 252 is formed by patterning the alumina film 252a by photolithography and etching.

In the inertial sensor 250, since the alumina film 252a is formed by the ALD method, the alumina film 252a has high denseness. Thus, the barrier layer 252 can function as a barrier layer against moisture.

2. Second Embodiment

2.1. Inertial Sensor

Figure 21:
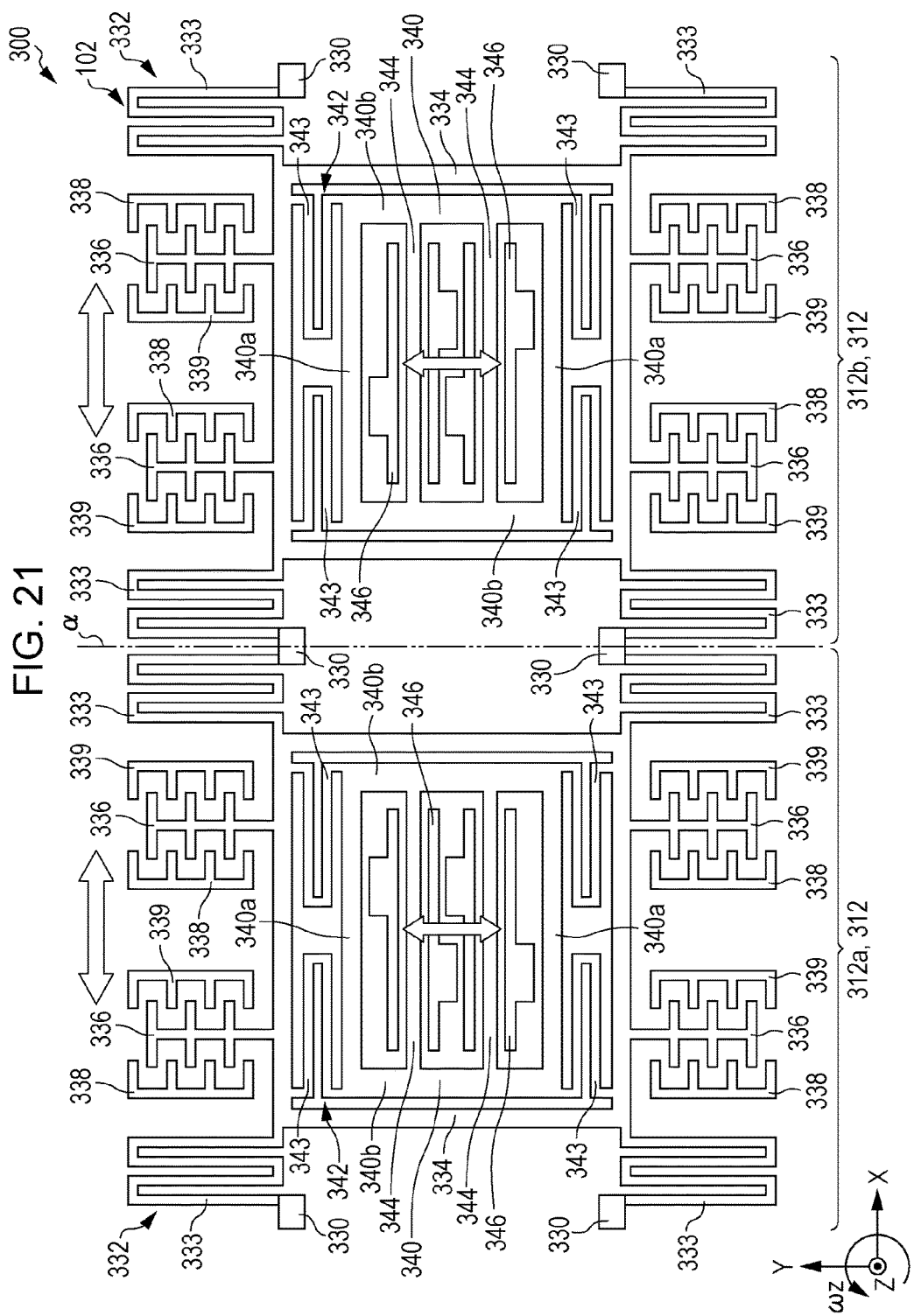
FIG. 21 is a plan view schematically illustrating an inertial sensor according to a second embodiment.

Next, an inertial sensor according to a second embodiment will be described with reference to the drawing. FIG. 21 is a plan view schematically illustrating an inertial sensor 300 according to a second embodiment. Moreover, for the sake of convenience, in FIG. 21, members other than the functional element 102 are omitted. Furthermore, FIG. 21 illustrates an X axis, a Y axis, and a Z axis as three axes orthogonal to each other.

Hereinafter, in the inertial sensor 300 according to the second embodiment, points different from the example of the inertial sensor 100 according to the first embodiment are described and the description of the same points will be omitted.

As illustrated in FIG. 2, the inertial sensor 100 described above is the acceleration sensor for detecting the acceleration in the X axis direction. On the other hand, as illustrated in FIG. 21, the inertial sensor 300 is a gyro sensor that is capable of detecting an angular velocity ωz around the Z axis.

In the inertial sensor 300, a cavity 2 is preferably in a reduced pressure state (further preferably in a vacuum state). Thus, it is possible to suppress vibration of the functional element 102 from being attenuated by air viscosity.

In the inertial sensor 300, as illustrated in FIG. 21, the functional element 102 has two structure bodies 312 (first structure body 312a and second structure body 312b). The two structure bodies 312 are provided side by side in an X axis direction so as to be symmetrical with respect to an axis α parallel to a Y axis.

The structure body 312 has a fixed section 330, a driving spring section 332, a mass body 334, a movable driving electrode section 336, a fixed driving electrode sections 338 and 339, a movable body 340, a detection spring section 342, a movable detection electrode section 344, and a fixed detection electrode section 346. The driving spring section 332, the mass body 334, the movable driving electrode section 336, the movable body 340, the detection spring section 342, and the movable detection electrode section 344 are provided above a concave section 16, and are separated from a the base body 10.

The fixed section 330 is fixed to the base body 10. For example, the fixed section 330 is bonded to a first surface 12 of the base body 10 by anodic bonding. For example, four fixed sections 330 are provided with respect to one structure body 112. In the illustrated example, the structure bodies 312a and 312b have the fixed section 330 of the first structure body 312a on a side in the +X axis direction and the fixed section 330 of the second structure body 312b on a side in the −X axis direction as the common fixed section.

The driving spring section 332 connects the fixed section 330 and the mass body 334. The driving spring section 332 is constituted by a plurality of beam sections 333. The plurality of beam sections 333 are provided corresponding to the number of the fixed sections 330. The beam section 333 extends in the X axis direction while reciprocating in the Y axis direction. The beam section 333 (driving spring section 332) can smoothly expand and contact in the X axis direction that is a vibration direction of the mass body 334.

For example, the mass body 334 is a rectangular frame body in a plan view. A side surface (side surface having a perpendicular parallel to the X axis) of the mass body 334 in the X axis direction is connected to the driving spring section 332. The mass body 334 can be vibrated in the X axis direction (along the X axis) by the movable driving electrode section 336 and the fixed driving electrode sections 338 and 339.

The movable driving electrode section 336 is provided in the mass body 334. In the illustrated example, four movable driving electrode sections 336 are provided, two movable driving electrode sections 336 are positioned on the side in the +Y axis direction of the mass body 334 and the other two movable driving electrode sections 336 are positioned on the side in the −Y axis direction of the mass body 334. As illustrated in FIG. 21, the movable driving electrode section 336 may have a comb-like shape including a stem section extending from the mass body 334 in the Y axis direction and a plurality of branch sections extending from the stem section in the X axis direction.

The fixed driving electrode sections 338 and 339 are fixed to the base body 10. For example, the fixed driving electrode sections 338 and 339 are bonded to the first surface 12 of the base body 10 by anodic bonding. The fixed driving electrode sections 338 and 339 are provided to face the movable driving electrode section 336 and the movable driving electrode section 336 is disposed between the fixed driving electrode sections 338 and 339. As illustrated in FIG. 21, if the movable driving electrode section 336 has the comb-like shape, the fixed driving electrode sections 338 and 339 may have a comb-like shape corresponding to the movable driving electrode section 336. For example, the first fixed driving electrode section 338 is electrically connected to the second wiring 42 through a contact section. For example, the second fixed driving electrode section 339 is electrically connected to the third wiring 44 through a contact section.

The movable body 340 is supported on the mass body 334 through the detection spring section 342. The movable body 340 is provided on an inside of the frame shaped mass body 334 in a plan view. In the illustrated example, the movable body 340 is a rectangular frame body in a plan view. The movable body 340 has a first extension section 340a extending in the X axis direction and a second extension section 340b extending in the Y axis direction. A side surface (side surface having a perpendicular parallel to the Y axis) of the movable body 340 in the Y axis direction is connected to the detection spring section 342. The movable body 340 is electrically connected to the first wiring 40 through the detection spring section 342, the mass body 334, the driving spring section 332, the fixed section 330, and the contact section.

The detection spring section 342 is connected to the movable body 340 and the mass body 334. The detection spring section 342 is constituted by a plurality of beam sections 343. The beam section 343 extends in the Y axis direction while reciprocating in the X axis direction. The beam section 343 (detection spring section 342) can smoothly expand and contract in the Y axis direction that is a displacement direction of the movable body 340.

The movable detection electrode section 344 is provided in the movable body 340. For example, the movable detection electrode section 344 extends from the second extension section 340b of one side of the movable body 340 to the second extension section 340b of the other side in the X axis direction. In the illustrated example, two movable detection electrode sections 344 are provided with respect to one structure body 312. The movable detection electrode section 344 is electrically connected to the first wiring 40 through the movable body 340 and the like.

The fixed detection electrode section 346 is fixed to the base body 10 and is provided to face the movable detection electrode section 344. For example, the fixed detection electrode section 346 is bonded to a post section (not illustrated) provided in a bottom surface (surface of the base body 10 defining the concave section 16) of the concave section 16 by anodic bonding. The post section protrudes above more than the bottom surface of the concave section 16. The fixed detection electrode section 346 is provided on the inside of the frame shaped movable body 340 in a plan view. In the illustrated example, the movable detection electrode section 344 is interposed between the fixed detection electrode sections 346. For example, the fixed detection electrode section 346 is electrically connected to wiring (not illustrated) through the contact section.

The fixed section 330, the driving spring section 332, the mass body 334, the movable driving electrode section 336, the movable body 340, the detection spring section 342, and the movable detection electrode section 344 are integrally provided. For example, a material of the fixed section 330, the driving spring section 332, the mass body 334, the movable driving electrode section 336, the fixed driving electrode sections 338 and 339, the movable body 340, the detection spring section 342, the movable detection electrode section 344, and the fixed detection electrode section 346 is silicon to which conductivity is given by doping impurities such as phosphorus and boron.

Next, an operation of the inertial sensor 300 will be described.

If a voltage is applied between the movable driving electrode section 336 and the fixed driving electrode sections 338 and 339 by power supply (not illustrated), it is possible to generate an electrostatic force between the movable driving electrode section 336 and the fixed driving electrode sections 338 and 339. Thus, it is possible to vibrate the mass body 334 in the X axis direction while extending and contracting the driving spring section 332 in the X axis direction.

As illustrated in FIG. 21, in the first structure body 312a, the first fixed driving electrode section 338 is disposed on the side in the −X axis direction of the movable driving electrode section 336 and the second fixed driving electrode section 339 is disposed on the side in the +X axis direction of the movable driving electrode section 336. In the second structure body 312b, the first fixed driving electrode section 338 is disposed on the side in the +X axis direction of the movable driving electrode section 336 and the second fixed driving electrode section 339 is disposed on the side in the −X axis direction of the movable driving electrode section 336. Thus, a first alternating voltage is applied between the movable driving electrode section 336 and the first fixed driving electrode section 338, and a second alternating voltage that is shifted from the first alternating voltage by 180 degrees is applied between the movable driving electrode section 336 and the second fixed driving electrode section 339, and thereby it is possible to vibrate (vibrate in a tuning-fork type) the mass body 334 of the first structure body 312a and the mass body 334 of the second structure body 312b in the X axis direction with opposite phase and a predetermined frequency.

In a state where the mass body 334 is vibrated as described above, if an angular velocity ωz is added to the inertial sensor 300 around the Z axis, a Coriolis force is operated, the movable body 340 of the first structure body 312a and the movable body 340 of the second structure body 312b are displaced in the opposite direction to each other in the Y axis direction (along the Y axis). The movable body 340 repeats the operation during receiving the Coriolis force.

The movable body 340 is displaced in the Y axis direction and thereby a distance between the movable detection electrode section 344 and the fixed detection electrode section 346 is changed. Thus, an electrostatic capacitance between the movable detection electrode section 344 and the fixed detection electrode section 346 is changed. It is possible to obtain the angular velocity ωz around the Z axis by detecting a change amount of the electrostatic capacitance between the electrode sections 344 and 346.

Moreover, in the above description, an aspect (electrostatic driving type) in which the mass body 334 is driven by the electrostatic force is described, but a method of driving the mass body 334 is not specifically limited and a piezoelectric driving type, an electromagnetic driving type using a Lorentz force of a magnetic field, and the like can be applied.

In the inertial sensor 300, similar to the inertial sensor 100, it is possible to suppress the first sealing material 30 from attaching to the movable body 340.

Moreover, in the above description, a case where the inertial sensor 300 is the gyro sensor that is capable of detecting the angular velocity ωz around the Z axis is described, but the inertial sensor according to the invention may be a gyro sensor that is capable of detecting the angular velocity around the x axis or may be a gyro sensor capable of detecting the angular velocity around the Y axis.

In addition, in the above description, the inertial sensor including one functional element 102 is described, but the inertial sensor according to the invention may include a plurality of functional elements. Thus, the inertial sensor according to the invention can detect the accelerations of the X axis, the Y axis, and the Z axis, and may detect the angular velocities around the X axis, the Y axis, and the Z axis. That is, the inertial sensor according to the invention may include the function as the acceleration sensor and the function as the gyro sensor.

2.2. Manufacturing Method of Inertial Sensor

Next, a manufacturing method of the inertial sensor 300 according to the second embodiment will be described with reference to the drawings. The manufacturing method of the inertial sensor 300 according to the second embodiment is basically the same as the manufacturing method of the inertial sensor 100 according to the first embodiment except that the silicon substrate 4 is patterned such that the functional element 102 becomes the shape illustrated in FIG. 21, the process of heating and melting the solder ball 32a is performed at the reduced pressure atmosphere, and the cavity 2 is in the reduced pressure state. Thus, detailed description will be omitted.

The embodiments and the modification examples described above are an example and the invention is not limited thereto. For example, it is possible to appropriately combine each embodiment and each modification example.

The invention includes the substantially same configuration (for example, the same configuration in function, method, and result, or the same configuration in object and effect) as the configuration described in the embodiments. Furthermore, the invention includes configurations that replace non-essential portions of the configurations described in the embodiments. Furthermore, the invention includes configurations that can obtain the same operational effect or the configuration that can achieve the same object as the configurations described in the embodiments. Furthermore, the invention includes configurations obtained by adding known techniques to the configurations described in the embodiments.

The entire disclosure of Japanese Patent Application No. 2014-231725, filed Nov. 14, 2014 is expressly incorporated by reference herein.

What is claimed is:

1. A manufacturing method of an inertial sensor which includes a movable body that is disposed in a cavity formed by a base body and a lid, and in which a wiring groove of wiring communicating with the cavity and electrically connected to the movable body is formed in the base body, the manufacturing method comprising:
   forming a first opening section, which does not penetrate through the lid by wet etching;
   accommodating the movable body in the cavity by bonding the base body and the lid;
   forming a first sealing material with which the wiring groove is sealed after the accommodating of the movable body;
   forming a through-hole communicating with the cavity by penetrating through the first opening section by dry etching after the forming of the first sealing material; and
   forming a second sealing material with which the through-hole is sealed.

2. The manufacturing method of an inertial sensor according to claim 1,
   wherein the forming of the first sealing material is performed by forming a thin film by a vapor phase growing method.

3. The manufacturing method of an inertial sensor according to claim 1,
   wherein the forming of the second sealing material is performed by heating and melting a solder ball.

4. The manufacturing method of an inertial sensor according to claim 1, further comprising:
   forming a second opening section, which does not penetrate through the lid, communicating with the cavity in the lid,
   wherein an opening area of the second opening section is smaller than the minimum opening area of the first opening section,
   wherein in the forming of the through-hole, the through-hole is formed by communicating the first opening section with the second opening section.

* * * * *